US006959490B2

(12) United States Patent
Miyata

(10) Patent No.: US 6,959,490 B2
(45) Date of Patent: Nov. 1, 2005

(54) METHOD OF MANUFACTURING SILICON DEVICE, METHOD OF MANUFACTURING LIQUID JET HEAD AND LIQUID JET HEAD

(75) Inventor: Yoshinao Miyata, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 153 days.

(21) Appl. No.: 10/637,003

(22) Filed: Aug. 8, 2003

(65) Prior Publication Data

US 2004/0085410 A1 May 6, 2004

(30) Foreign Application Priority Data

Aug. 12, 2002 (JP) ............................ 2002-234800
Aug. 5, 2003 (JP) ............................ 2003-286756

(51) Int. Cl.[7] ........................ H05K 3/02; G01D 15/00; G11B 5/127; B41J 2/045; H01L 21/44

(52) U.S. Cl. ............................ 29/847; 29/830; 29/831; 29/846; 216/27; 216/41; 216/33; 216/49; 347/68; 438/106; 438/127

(58) Field of Search .......................... 29/846, 847, 830, 29/831; 216/27, 41, 33, 49, 2; 347/68, 85, 347/95, 47; 438/106, 127

(56) References Cited

U.S. PATENT DOCUMENTS 5,686,360 A * 11/1997 Harvey et al. ................ 438/28
5,719,606 A * 2/1998 Kigawa et al. ............... 347/69
6,145,588 A * 11/2000 Martin et al. ............... 165/166
6,198,220 B1 * 3/2001 Jones et al. ................. 313/512

FOREIGN PATENT DOCUMENTS

JP 59-048838 A 3/1984
JP 05-102127 A 4/1993
JP 5-286131 A 11/1993
JP 06-175116 A 6/1994
JP 07-009681 A 1/1995
JP 09-116005 A 5/1997
JP 2002-036547 A 2/2002

* cited by examiner

*Primary Examiner*—A. Dexter Tugbang
*Assistant Examiner*—Tai Van Nguyen
(74) *Attorney, Agent, or Firm*—Sughrue Mion, PLLC

(57) ABSTRACT

Disclosed are a method f manufacturing a silicon device and a method of manufacturing a liquid jet head, which are capable of surely preventing damage of a piezoelectric element in manufacturing. In forming a thin-film pattern on one surface of a silicon wafer 100, a first moisture permeation preventive layer 96, which is so as to surround the entire thin-film pattern of the silicon wafer 100, is formed in the same layer as a first conductive layer 96 on the silicon wafer 100, a second moisture permeation preventive layer 114 having a narrower width than the first moisture permeation preventive layer 96 is formed in the same layer as an insulation layer 100 on the first moisture permeation preventive layer 96, and a third moisture permeation preventive layer 121 is formed in the same layer as a second conductive layer 120 on the second moisture permeation preventive layer 114 so as to cover the second moisture permeation preventive layer 114. Thus, a moisture permeation preventive pattern 130 is formed. Thereafter, a sealing plate is joined to the silicon wafer 100 through the moisture permeation preventive pattern 130 interposed therebetween, and a concave portion is formed by etching from the other surface of the silicon wafer 100. Thus, a silicon device is manufactured.

6 Claims, 9 Drawing Sheets

METHOD OF MANUFACTURING SILICON DEVICE, METHOD OF MANUFACTURING LIQUID JET HEAD AND LIQUID JET HEAD

BACKGROUND OF THE INVENTION

1. Field of the Invention

The present invention relates to a method of manufacturing a silicon device having a thin-film pattern on a silicon substrate. Particularly, the present invention is preferably applied to a liquid jet head and a manufacturing method thereof. Specifically, in the liquid jet head, a part of a pressure-generating chamber which communicates with a nozzle orifice ejecting an ink droplet is formed of a vibration plate, a piezoelectric element is formed on a surface of this vibration plate and the ink droplet is ejected by displacement of a piezoelectric layer.

2. Description of the Related Art

As a liquid jet apparatus, there is, for example, an ink-jet recording apparatus including an ink-jet recording head having: a plurality of pressure-generating chambers which generate pressures for ejecting ink droplets by use of a piezoelectric element or a heater element; a common reservoir which supplies ink to each of the pressure-generating chambers; and nozzle orifices which communicate with the respective pressure-generating chambers. In this ink-jet recording apparatus, an ejecting energy is applied to the ink in the pressure-generating chambers communicating with nozzles corresponding to a print signal, and thereby ink droplets are ejected from the nozzle orifices.

In the ink-jet recording head, a part of each pressure-generating chamber communicating with the nozzle orifice ejecting an ink droplet is formed by a vibration plate, and this vibration plate is deformed by the piezoelectric element. Thereafter, ink within the pressure-generating chambers is pressurized and thus the ink droplets are ejected from the nozzle orifices. There are two types of ink-jet recording heads which have been put to practical use, which include: one using a piezoelectric actuator of a longitudinal vibration mode, which extends and contracts in an axial direction of a piezoelectric element; and one using a piezoelectric actuator of a flexure vibration mode.

The former can change a volume of the pressure-generating chamber by allowing an end face of the piezoelectric element to abut on the vibration plate and can be manufactured as a bead suitable for high-density printing. On the other hand, a difficult process of cutting the piezoelectric element into a comb-teeth shape by allowing the piezoelectric element to coincide with an array pitch of the nozzle orifices, and work of aligning the cut piezoelectric elements with the pressure-generating chambers and fixing the piezoelectric elements thereto are required. Thus, there arises a problem that a manufacturing process thereof is complicated.

On the contrary, in the latter, the piezoelectric elements can be fabricated in the vibration plate by a relatively simple process of attaching a green sheet, a piezoelectric material, to the vibration plate in accordance with a shape of the pressure-generating chamber and performing baking thereof. Nevertheless, because of the use of flexure vibration, a certain area is required. Thus, there arises a problem that high-density arrangement is difficult.

Meanwhile, in order to resolve the inconvenience of the latter recording head, there is proposed one in which a uniform piezoelectric material layer is formed across the entire surface of the vibration plate by use of a deposition technology, and this piezoelectric material layer is cut into a shape corresponding to pressure-generating chambers by use of a lithography method. Piezoelectric elements are thus formed so as to be independent for each of the pressure-generating chambers [for example, Japanese Patent Laid-Open No. Heisei 5 (1993)-286131 (FIG. 8, Paragraph 0013)].

According to the above-described proposal, work of attaching the piezoelectric elements to the vibration plate is no longer required and the piezoelectric elements can be fabricated with high density by use of an accurate and simple method such as the lithography method, In addition, there is an advantage that a thickness of the piezoelectric element can be reduced and thus high-speed drive becomes possible.

As a method of manufacturing an ink-jet recording head of this kind, a vibration plate and piezoelectric elements are first formed on one side of a silicon wafer that is to be a passage-forming substrate and, thereafter; a sealing plate is joined with the silicon wafer. The sealing plate includes a piezoelectric element holding portion having an area which does not interfere with movement of the piezoelectric elements at the side of the piezoelectric elements on the silicon wafer. Subsequently, after forming pressure-generating chambers by etching the silicon wafer from the other side thereof, the head is formed by dividing the silicon wafer into a plurality of pieces [for example, Japanese Patent Laid-Open No. 2002-036547 (FIGS. 3 and 4, pp. 6 and 7)].

However, in joining the sealing plate with the silicon wafer, the height at which the silicon wafer abuts on the sealing plate becomes uneven depending on the lamination state of the thin-film pattern formed on the silicon wafer. Thus, there occurs a region where an adhesive agent is formed thick in joining them.

Accordingly, there arises a problem that an etching solution such as an alkaline solution used in etching the silicon wafer intrudes into the piezoelectric element holding portion via the adhesive agent, and thus the piezoelectric elements are damaged.

Moreover, there is another proposal of an ink-jet recording head having a structure in which an insulation layer and a wiring connection layer are sequentially laminated on electrodes of piezoelectric elements or on extraction electrodes together with the piezoelectric elements on a silicon wafer, thus preventing a voltage drop of a common electrode of the respective piezoelectric elements. However, with such a structure, there is a problem that the thickness of an adhesive agent in a region where the silicon wafer and a sealing plate are joined becomes thick and, particularly, an etching solution intrudes into a piezoelectric element holding portion via the adhesive agent.

Furthermore, needless to say, such problems as described above similarly exist not only in the method of manufacturing the ink-jet recording head ejecting ink but also in a method of manufacturing a silicon device such as another liquid jet head ejecting a liquid other than ink.

SUMMARY OF THE INVENTION

In consideration of the circumstances as described above, an object of the present invention is to provide a method of manufacturing a silicon device, a method of manufacturing a liquid jet head and a liquid jet head, all of which can surely prevent destruction of a thin-film pattern in manufacturing.

A first aspect of the present invention for addressing the foregoing problem is a method of manufacturing a silicon device in which a sealing plate having a thin-film pattern holding portion defining a space for sealing a thin-film pattern is joined to a silicon substrate which has the thin-film pattern configured by sequentially laminating at least a first conductive layer, an insulation layer and a second conductive layer that are sequentially laminated and has a concave portion on a side opposed to the thin-film pattern. In forming the thin-film pattern on one surface of a silicon wafer, a moisture permeation preventive pattern is formed in such a manner that a first moisture permeation preventive layer is formed in the same layer as the first conductive layer on the silicon wafer so as to surround the entire thin-film pattern of the silicon wafer, a second moisture permeation preventive layer with a width narrower than that of the first moisture permeation preventive layer is formed in the same layer as the insulation layer on the first moisture permeation preventive layer, and a third moisture permeation preventive layer is formed in the same layer as the second conductive layer on the second moisture permeation preventive layer so as to cover the second moisture permeation preventive layer. Thereafter, the sealing plate is joined on the silicon wafer through the moisture permeation preventive pattern interposed therebetween and the concave portion is formed by etching the silicon wafer from the other surface thereof.

In the first aspect, the silicon wafer and the sealing plate are joined through the moisture permeation preventive pattern interposed therebetween. Therefore, an adhesive agent is formed to be relatively thin on the moisture permeation preventive pattern, thus preventing an etching solution used in etching the silicon wafer from intruding into the thin-film pattern holding portion via the adhesive agent. Moreover, since the second moisture permeation preventive layer included in the moisture permeation preventive pattern is covered by the first and third moisture permeation preventive layers, the etching solution does not melt the second moisture permeation preventive layer. Thus, the etching solution can be prevented from intruding into the thin-film pattern holding portion via the second moisture permeation preventive layer, and destruction of piezoelectric elements can be surely prevented. Furthermore, since the silicon wafer and the sealing plate are joined through the moisture permeation preventive pattern interposed therebetween, the adhesive agent can be formed to have a desired thickness between the silicon wafer and the sealing plate, and thereby the silicon wafer and the sealing plate can be surely joined.

A second aspect of the present invention is the method of manufacturing a silicon device according to the first aspect, characterized in that the moisture permeation preventive pattern is continuously formed along a peripheral portion of the silicon wafer.

In the second aspect, the moisture permeation preventive pattern formed continuously along the peripheral portion can prevent the thin-film pattern from being damaged by the etching solution.

A third aspect of the present invention is the method of manufacturing a silicon device according to one of the first and second aspects, characterized in that the concave portion is formed by subjecting the silicon wafer to wet etching.

In the third aspect, patterning of the silicon wafer can be performed with high precision by wet etching.

A fourth aspect of the present invention is the method of manufacturing a silicon device according to any one of the first to third aspects, characterized in that the second moisture permeation preventive layer is made of photosensitive resin.

In the fourth aspect, the second moisture permeation preventive layer including the insulation layer can be formed relatively easily with high precision.

A fifth aspect of the present invention is the method of manufacturing a silicon device according to the fourth aspect, characterized in that the photosensitive resin is polyimide.

In the fifth aspect, by use of the predetermined photosensitive resin, an insulation layer having a high insulation property can be relatively easily formed with high precision.

A sixth aspect of the present invention is the method of manufacturing a silicon device according to any one of the first to third aspects, characterized in that the second moisture permeation preventive layer is made of fluorocarbon resin, silicone resin, epoxy resin, silicon dioxide, silicon nitride or tantalum oxide.

In the sixth aspect, by use of a predetermined material, an insulation layer having a high insulation property can be relatively easily formed with high precision.

A seventh aspect of the present invention is a method of manufacturing a liquid jet head including: a passage-forming substrate in which pressure-generating chambers communicating with nozzle orifices are defined; piezoelectric elements which are provided on the passage-forming substrate via a vibration plate and apply pressures to the pressure-generating chambers; extraction electrodes extracted from individual electrodes of the piezoelectric elements; an insulation layer which is continuously provided along a direction in which the piezoelectric elements are arranged at least in a region facing the vicinity of ends in the longitudinal direction of the piezoelectric elements so as to cover at least a part of that extraction electrodes and which has a penetrated portion in a region facing a common electrode of the plurality of piezoelectric elements; a connection wiring layer which is continuously provided on the insulation layer in the direction in which the piezoelectric elements are arranged and which is electrically connected to the common electrode via the penetrated portion; and a sealing plate which is joined to a surface of the passage-forming substrate at a side of the piezoelectric element and which has a piezoelectric element holding portion securing a space which does not interfere with movement of the piezoelectric elements. The method has the steps of: forming the vibration plate and the piezoelectric elements on a silicon wafer; forming a moisture permeation preventive pattern including first to third moisture permeation preventive layers in such a manner that the extraction electrode is formed in a junction region where a sealing plate forming material to be the sealing plate is joined to the silicon wafer, and simultaneously, the first moisture permeation preventive layer electrically independent of the extraction electrode is formed in the same layer as the extraction electrode so as to surround the entire piezoelectric elements formed on the silicon wafer, the insulation layer is formed simultaneously with the second moisture permeation preventive layer formed in the same layer as the insulation layer on the first moisture permeation preventive layer so as to have a narrower width than the first moisture permeation preventive layer, and the connection wiring layer is formed simultaneously with the third moisture permeation preventive layer, electrically independent of the connection wiring layer, which is formed in the same layer as the connection wiring layer on the second moisture permeation preventive layer so as to cover the second moisture permeation preventive layer; joining the sealing plate forming material onto the silicon wafer through the moisture permeation preventive pattern interposed therebetween; forming the pressure-generating chambers by etching the silicon wafer; and dividing the silicon wafer and the sealing plate forming material into a predetermined size.

In the seventh aspect, the silicon wafer and the sealing plate are joined through the moisture permeation preventive pattern interposed therebetween. Therefore, an adhesive agent is formed to be relatively thin on the moisture permeation preventive pattern, thus preventing an etching solution used in etching the silicon wafer from intruding into the piezoelectric element holding portion via the adhesive agent. Moreover, since the second moisture permeation preventive layer included in the moisture permeation preventive pattern is covered by the first and third moisture permeation preventive layers, the etching solution does not melt the second moisture permeation preventive layer. Thus, the etching solution can be prevented from intruding into the piezoelectric element holding portion via the second moisture permeation preventive layer, and destruction of piezoelectric elements can be surely prevented. Furthermore, since the silicon wafer and the sealing plate are joined through the moisture permeation preventive pattern interposed therebetween, the adhesive agent can be formed to have a desired thickness between the passage-forming substrate and the sealing plate, and thereby the passage-forming substrate and the sealing plate can be surely joined.

An eighth aspect of the present invention is the method of manufacturing a liquid jet head according to the seventh aspect, characterized in that the moisture permeation preventive pattern is continuously formed along a peripheral portion of the silicon wafer.

In the eighth aspect, the moisture permeation preventive pattern formed continuously along the peripheral portion can prevent the piezoelectric elements from being damaged by the etching solution.

A ninth aspect of the present invention is the method of manufacturing a liquid jet head according to one of the seventh and eighth aspects, characterized in that the moisture permeation preventive pattern is formed continuously along a periphery of a region to be divided in the silicon wafer.

In the ninth aspect, the moisture permeation preventive pattern formed continuously along the periphery of the region to be divided can prevent the piezoelectric elements from being damaged by the etching solution.

A tenth aspect of the present invention is the method of manufacturing a liquid jet head according to any one of the seventh to ninth aspects, characterized in that the moisture permeation preventive pattern includes an individual moisture permeation preventive pattern surrounding each of the piezoelectric element holding portions.

In the tenth aspect, since the individual moisture permeation preventive pattern is provided, moisture can be prevented from permeating into the piezoelectric element holding portion via the adhesive agent from the outside when obtaining a liquid jet head by division. Thus, damage of the piezoelectric elements attributable to the external environment can be surely prevented.

An eleventh aspect of the present invention is the method of manufacturing a liquid jet head according to any one of the seventh to tenth aspects, characterized in that the pressure-generating chambers are formed by performing wet etching of the silicon wafer.

In the eleventh aspect, by performing wet etching, the pressure-generating chambers can be formed in th silicon wafer with high density and high precision.

A twelfth aspect of the present invention is the method of manufacturing a liquid jet head according to any one of the seventh to eleventh aspects, characterized in that the insulation layer is made of photosensitive resin.

In the twelfth aspect, the second moisture permeation preventive layer included in the insulation layer can be relatively easily formed with high precision.

A thirteenth aspect of the present invention is the method of manufacturing a liquid jet head according to the twelfth aspect, characterized in that the photosensitive resin is polyimide.

In the thirteenth aspect, by use of the predetermined photosensitive resin, an insulation layer having a high insulation property can be relatively easily formed with high precision.

A fourteenth aspect of the present invention is the method of manufacturing a liquid jet head according to any one of the seventh to eleventh aspects, characterized in that the insulation layer is made of fluorocarbon resin, silicone resin, epoxy resin, silicon dioxide, silicon nitride or tantalum oxide.

In the fourteenth aspect, by use of the predetermined material, the insulation layer having a high insulation property can be relatively easily formed with high precision.

A fifteenth aspect of the present invention is a liquid jet head including: a passage-forming substrate in which pressure-generating chambers communicating with nozzle orifices are defined; piezoelectric elements which are provided on the passage-forming substrate via a vibration plate and apply pressures to the pressure-generating chambers; extraction electrodes extracted from individual electrodes of the piezoelectric elements; an insulation layer which is continuously provided along a direction in which the piezoelectric elements are arranged at least in a region facing the vicinity of ends in the longitudinal direction of the piezoelectric elements so as to cover at least a part of each traction electrodes and which has a penetrated portion in a region facing a common electrode of the plurality of piezoelectric elements; a connection wiring layer which is continuously provided on the insulation layer in the direction in which the piezoelectric elements are arranged and which is electrically connected to the common electrode via the penetrated portion; and a sealing plate which is joined to a surface of the passage-forming substrate at the side of the piezoelectric element and which has a piezoelectric element holding portion securing a space which does not interfere with movement of the piezoelectric elements. The liquid jet head is obtained by dividing a silicon wafer having the pressure-generating chambers formed thereon by etching thereof into a predetermined size after joining the silicon wafer and a sealing plate forming material through a moisture permeation preventive pattern interposed therebetween, the pattern being formed in a junction region where the sealing plate forming material to be the sealing plate is joined to the silicon wafer having the vibration plate and the piezoelectric elements formed thereon and including a first moisture permeation preventive layer which is electrically independent of the extraction electrode and is formed in the same layer as the extraction electrode so as to surround the entire piezoelectric elements, a second moisture permeation preventive layer which is formed in the same layer as the insulation layer on the first moisture permeation preventive layer so as to have a narrower width than the first moisture permeation preventive layer, and a third moisture permeation preventive layer which is electrically independent of the connection wiring layer and is formed in the same layer as the connection wiring layer on the second moisture permeation preventive layer so as to cover the second moisture permeation preventive layer.

In the fifteenth aspect, the silicon wafer and the sealing plate are joined through the moisture permeation preventive pattern interposed therebetween. Therefore, an adhesive agent is formed to be relatively thin on the moisture permeation preventive pattern, thus preventing an etching solution used in etching the silicon wafer from intruding into the piezoelectric element holding portion via the adhesive agent. Moreover, since the second moisture permeation preventive layer included in the moisture permeation preventive pattern is covered by the first and third moisture permeation preventive layers, the etching solution does not melt the second moisture permeation preventive layer. Thus, the etching solution can be prevented from intruding into the piezoelectric element holding portion via the second moisture permeation preventive layer, and destruction of piezoelectric elements can be surely prevented. Furthermore, since the silicon wafer and the sealing plate are joined through the moisture permeation preventive pattern interposed therebetween, the adhesive agent can be formed to have a desired thickness between the passage-forming substrate and the sealing plate. Thus, the liquid jet head in which the passage-forming substrate and the sealing plate are surely joined can be obtained.

A sixteenth aspect of the present invention is the liquid jet head according to the fifteenth aspect, characterized in that, at least in a part of the junction region between the passage-forming substrate and the sealing plate, a part of the moisture permeation preventive pattern is present.

In the sixteenth aspect, the moisture permeation preventive pattern may be formed in th junction region between the passage-forming substrate and the sealing plate. Thus, the moisture permeation preventive pattern can be easily formed and the silicon wafer can be easily divided.

A seventeenth aspect of the present invention is a liquid jet head including: a passage-forming substrate in which pressure-generating chambers communicating with nozzle orifices are defined; piezoelectric elements which are provided on the passage-forming substrate via a vibration plate and apply pressures to the pressure-generating chambers; extraction electrodes extracted from individual electrodes of the piezoelectric elements; an insulation layer which is continuously provided along a direction in which the piezoelectric elements are arranged at least in a region facing the vicinity of ends in the longitudinal direction of the piezoelectric elements so as to cover at least a part of each extraction electrode and which has a penetrated portion in a region facing a common electrode of the plurality of piezoelectric elements; a connection wing layer which is continuously provided on the insulation layer in the direction in which the piezoelectric elements are arranged and which is electrically connected to the common electrode via the penetrated portion; and a sealing plate which is joined to a surface of the passage-forming substrate at a side of the piezoelectric element and which has a piezoelectric element holding portion securing a space which does not interfere with movement of the piezoelectric elements. The liquid jet head has a laminated pattern including: a first conductive layer which is formed in the same layer as the extraction electrode at least in a part of the junction region between the passage-forming substrate and the sealing plate and which is electrically independent of the extraction electrode; an interlay r insulation layer which is formed in the same layer as the insulation layer on the first conductive layer so as to have a narrower width than the first conductive layer; and a second conductive layer which is formed in the same layer as the connection wiring layer on the interlayer insulation layer so as to cover the interlayer insulation layer and which is electrically independent of the connection wiring layer.

In the seventeenth aspect, the laminated pattern provided between the passage-forming substrate and the sealing plate can prevent moisture from permeating into the piezoelectric element holding portion via the adhesive agent from the outside, and thus damage of the piezoelectric elements attributable to the external environment can be surely prevented.

An eighteenth aspect of the present invention is the liquid jet head according to the seventeenth aspect, characterized in that the laminated pattern is the moisture permeation preventive pattern which is continuously provided so as to surround the entire piezoelectric elements in a state of the silicon wafer to be divided into the passage-forming substrate and which is formed in the junction region between the silicon wafer and the sealing plate forming material to be the sealing plate by division.

In the eighteenth aspect, the silicon wafer and the sealing plate forming material are joined through the moisture permeation preventive pattern interposed therebetween in manufacturing. Thus, an adhesive agent is formed to be relatively thin on the moisture permeation preventive pattern, thus preventing an etching solution used in etching the silicon wafer from intruding into the piezoelectric element holding portion via the adhesive agent. Moreover, since the silicon wafer and the sealing plate forming material are joined through the moisture permeation preventive pattern interposed therebetween, the adhesive agent can be formed to have a desired thickness between the passage-forming substrate and the sealing plate and the silicon wafer. Thus, the liquid jet head in which the passage-forming substrate and the sealing plate are surely joined can be obtained.

A nineteenth aspect of the present invention is the liquid jet head according to one of the seventeenth and eighteenth aspects, characterized in that the laminated pattern includes an individual moisture permeation preventive pattern continuously provided so as to surround the piezoelectric element holding portion.

In the nineteenth aspect, the individual moisture permeation preventive pattern provided between the passage-forming substrate and the sealing plate can prevent moisture from permeating into the piezoelectric element holding portion via the adhesive agent from the outside, and damage of the piezoelectric elements attributable to the external environment can be surely prevented.

DESCRIPTION OF THE EMBODIMENTS

The present invention will be described in detail herein below based on embodiments.

(Embodiment 1)

Figure 1:
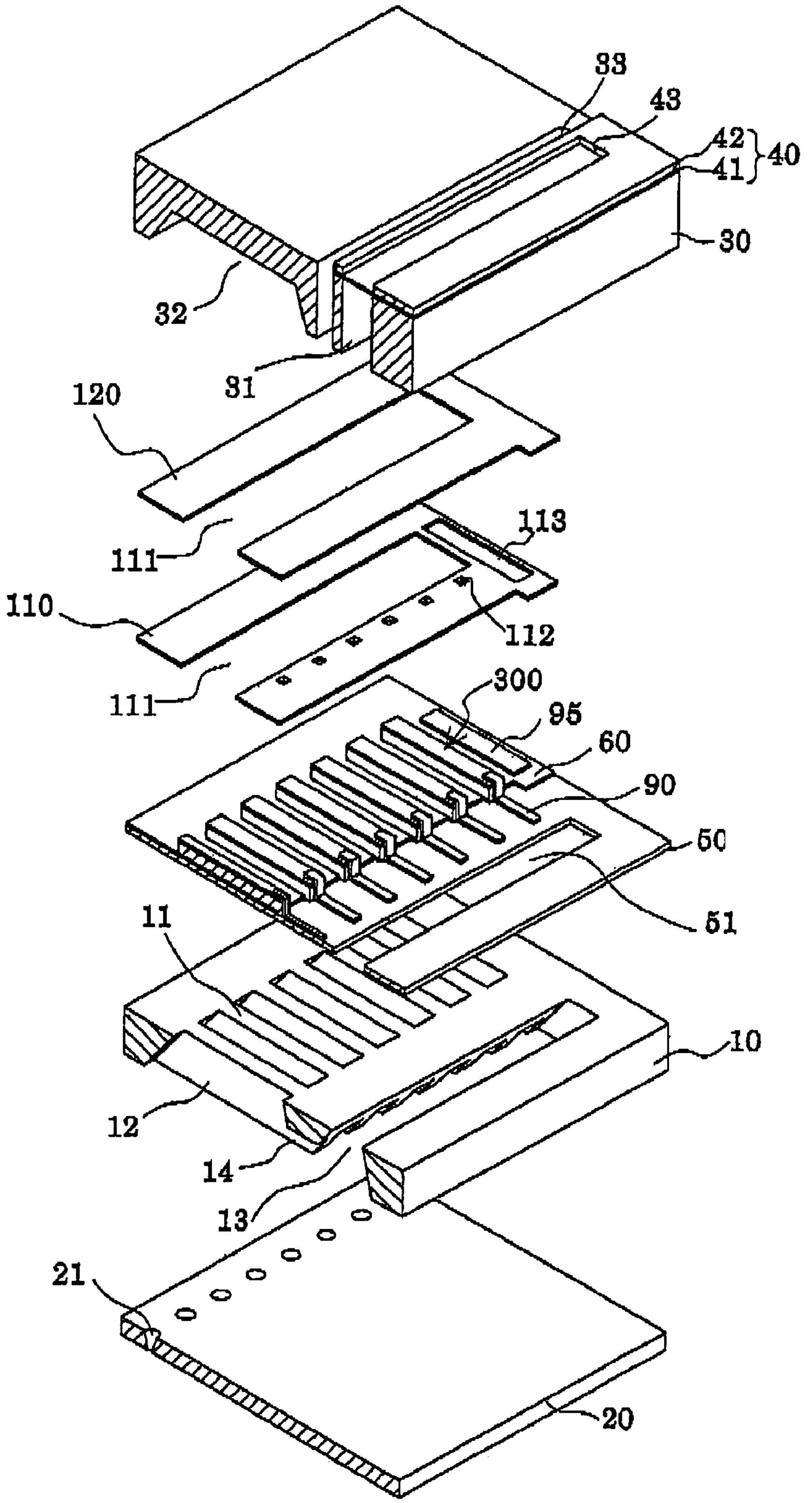
FIG. 1 is an exploded perspective view of an ink-jet recording head according to Embodiment 1 of the present invention.
Figure 2A:
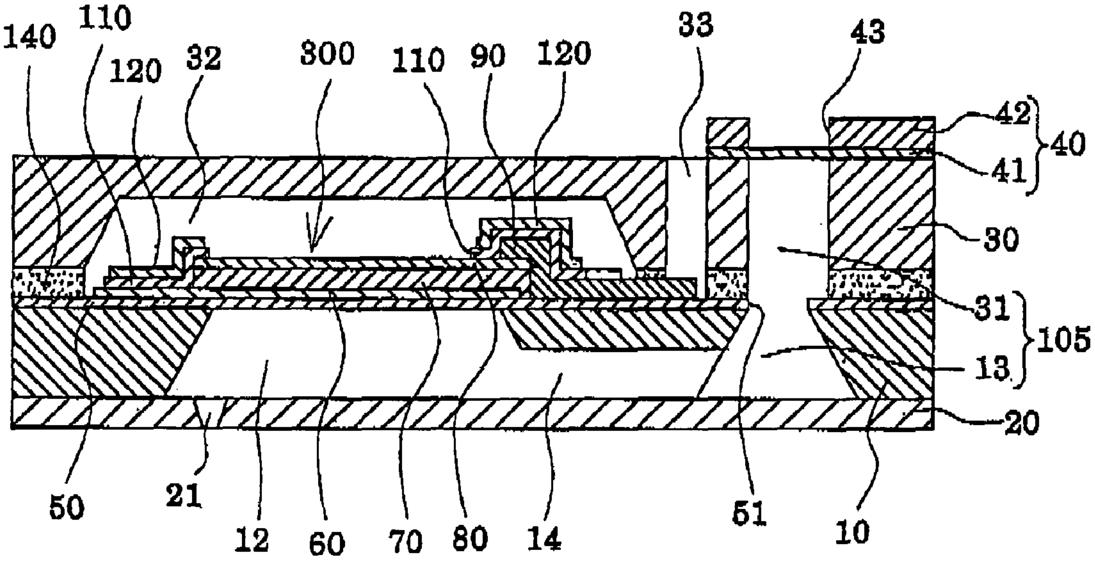
FIGS. 2A and 2B are cross-sectional views of the ink-jet recording head according to Embodiment 1 of the present invention.
Figure 2B:
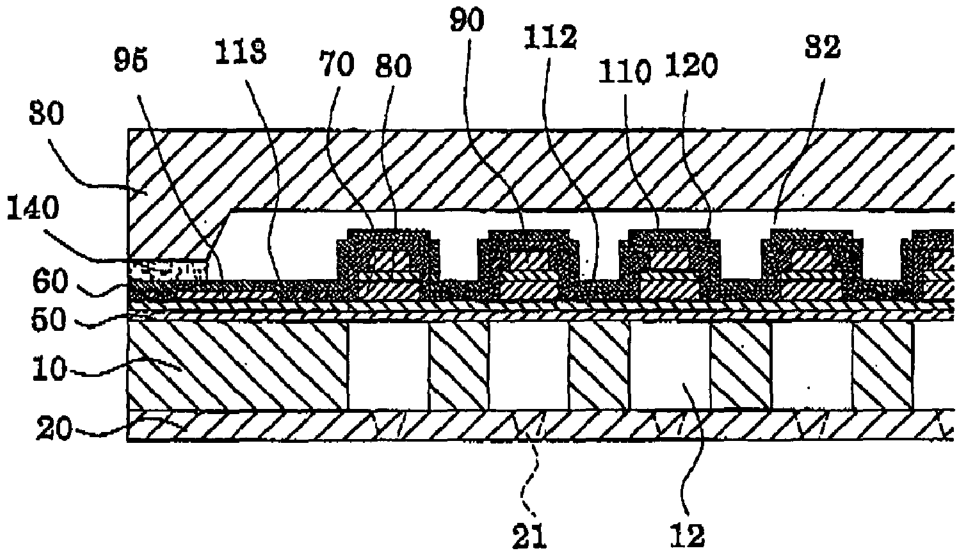
Figure 3:
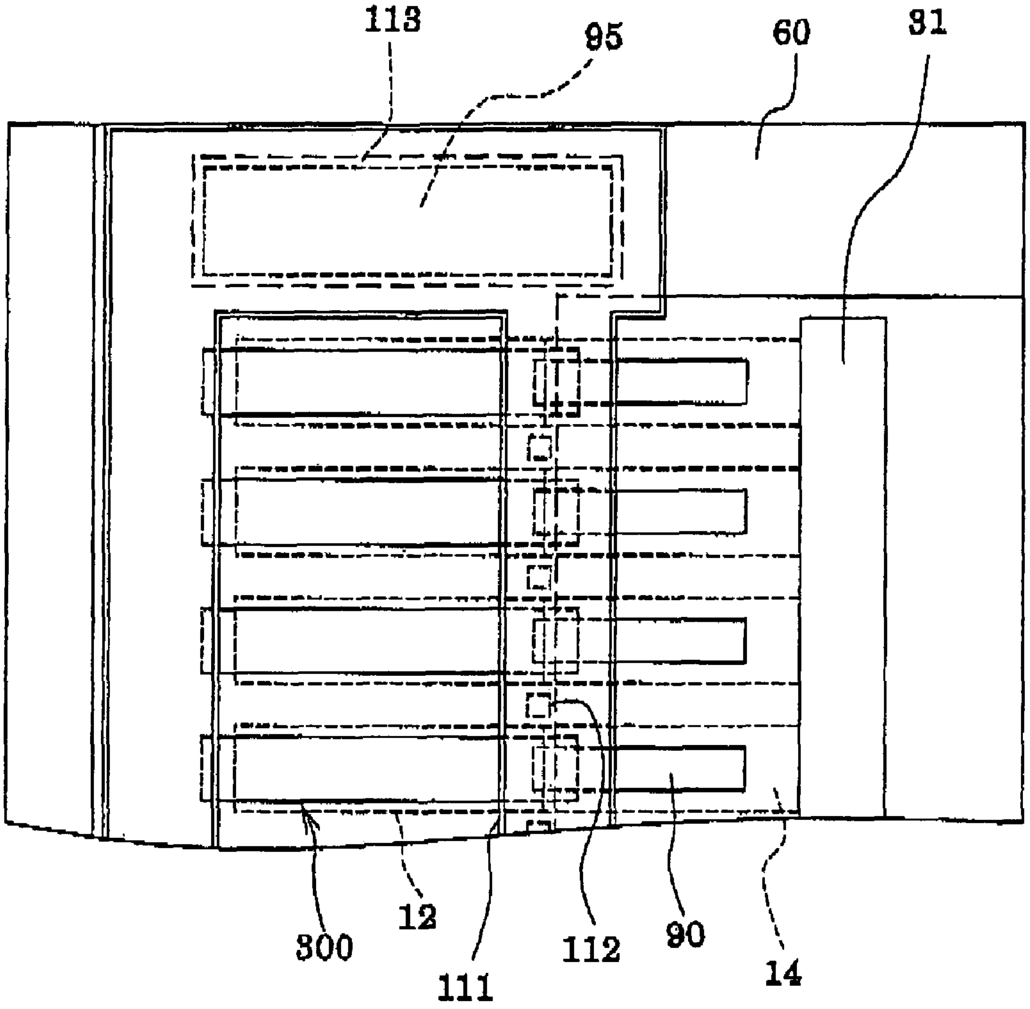
FIG. 3 is a plan view showing a wiring structure of the ink-jet recording head according to Embodiment 1 of the present invention.

FIG. 1 is an exploded perspective view showing an ink-jet recording head according to Embodiment 1 of the present invention, FIGS. 2A and 2B are cross-sectional views of FIG. 1 and FIG. 3 is a plan view showing a wiring structure of the ink-jet recording head according to Embodiment 1.

As shown in the drawings, a passage-forming substrate 10 is made of a single crystal silicon substrate of plane orientation (110) in this embodiment and, on one surface thereof, a plurality of pressure-generating chambers 12 formed by anisotropic etching are arranged in a width direction of the substrate. Moreover, on the outside in a longitudinal direction of the pressure-generating chambers 12, a communicating portion 13 is formed, which communicates with a reservoir portion 31 of a sealing plate 30 to be described later and constitutes a part of a reservoir to be a common ink chamber of the respective pressure-generating chambers 12. The communicating portion 13 communicates with one end portions in the longitudinal direction of the respective pressure-generating chambers 12 via ink supply paths 14, respectively.

Moreover, the one surface of this passage-forming substrate 10 is an open face and an elastic film 60 with a thickness of 1 to 2 μm, which is made of silicon dioxide previously formed by thermal oxidation, is formed on the other surface thereof.

Here, anisotropic etching is performed by utilizing a difference in an etching rate of the single crystal silicon substrate. For example, in this embodiment, when the single crystal silicon substrate is dipped in an alkaline solution such as KOH, the substrate is gradually eroded and there appear a first (111) plane perpendicular to the (110) plane and a second (111) plane positioned at about a 70-degree angle with this first (111) plane and at about a 35-degree angle with the foregoing (110) plane. Accordingly, an etching rate of the (111) planes is compared to that of the (110) plane. Thus, the anisotropic etching is performed by utilizing a characteristic that the etching rate of the (111) planes is about 1/180 of that of the (110) plane. By use of the anisotropic etching, high-precision processing can be performed by taking a depth processing in a parallelogram shape, which is formed by two of the first (111) planes and two of the oblique second (111) planes, as its basis.

In this embodiment, long sides of each pressure-generating chamber 12 are formed by the first (111) planes and short sides thereof are formed by the second (111) planes, This pressure-generating chamber 12 is formed by performing etching up to the elastic film 50 while nearly penetrating the passage-forming substrate 10. Here, an extremely small part of the elastic film 50 is dipped in the alkaline solution used in etching the single crystal silicon substrate. Moreover, each of the ink supply paths 14 communicating with the end of its respective pressure-generating chambers 12 is formed to be shallower than the pressure-generating chamber 12 and thus a passage resistance of ink flowing into the pressure-generating chamber 12 is maintained constant. Specifically, the ink supply path 14 is formed by performing half-etching of the single crystal silicon substrate in its thickness direction. Note that the half-etching is performed by controlling the etching time.

Note that a thickness of the passage-forming substrate 10, in which pressure-generating chambers 12 of this hand and the like are formed, is preferably selected to be optimum in accordance with a density of arrangement of the pressure-generating chambers 12. For example, in the case of arranging about 180 pressure-generating chambers 12 per inch (180 dpi), the thickness of the passage-forming substrate 10 is preferably set to about 180 to 280 μm, more preferably set to about 220 μm. Moreover, in the case of arranging the pressure-generating chambers 12 as relatively densely as, for example, about 360 dpi, the thickness of the passage-forming substrate 10 is preferably set to 100 μm or less. This is because an array density of the pressure-generating chambers 12 can be increased while maintaining rigidity of partitions 11 between the adjacent pressure-generating chambers 12.

Figure 4:
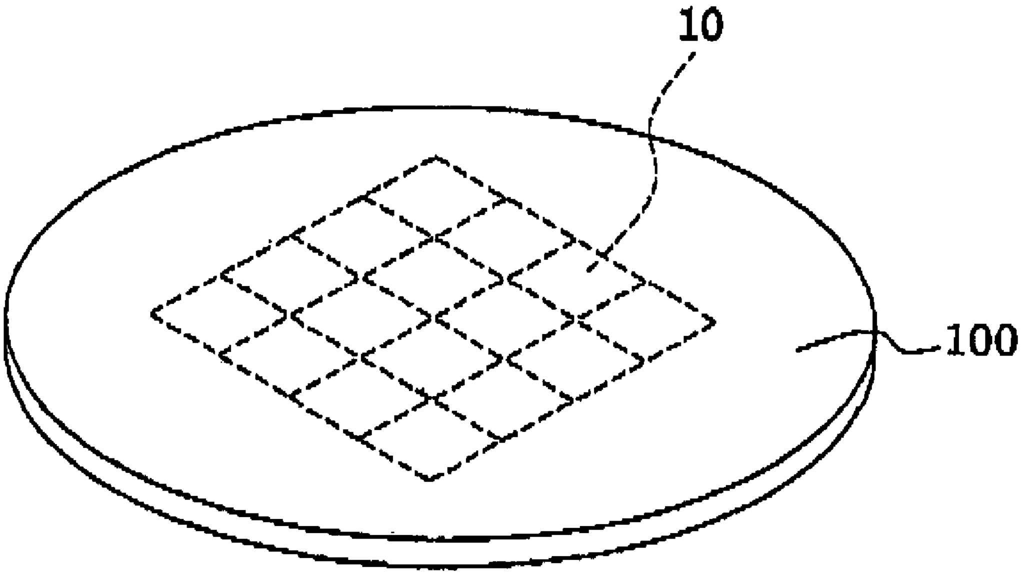
FIG. 4 is a perspective view showing a silicon wafer according to Embodiment 1 of the present invention.

Note that, as shown in FIG. 4, a plurality of such passage-forming substrates 10 are integrally formed on a silicon wafer 100 made of a single crystal silicon substrate. Accordingly, as described later in detail, after joining the sealing plate 30 and the like with this silicon wafer 100, the pressure-generating chambers 12 and the like are formed on the silicon wafer 100, the silicon wafer 100 is divided into pieces and thus a plurality of the passage-forming substrates 10 are obtained.

Moreover, at the open face side of the passage-forming substrate 10, a nozzle plate 20 having a nozzle orifice 21 drilled therein is fixed by use of an adhesive agent, a thermowelding film or the like, the nozzle orifice 21 communicating with the ink supply path 14 of each pressure-generating chamber 12 at the opposite side. Note that the nozzle plate 20 is made of glass ceramics, stainless steel or the like having a thickness of, for example, 0.1 to 1 mm and a linear expansion coefficient of, for example, 2.5 to 4.5 [$\times 10^{-6}$/° C.] at 300° C. or lower. The nozzle plate 20 entirely covers the one surface of the passage-forming substrate 10 with its one surface and serves as a reinforcing plate which protects the single crystal silicon substrate from impact and external force. Moreover, the nozzle plate 20 may be formed by a material having approximately the same coefficient of thermal expansion as that of the passage-forming substrate 10. In this case, the passage-forming substrate 10 and the nozzle plate 20 are deformed by heat approximately in the same manner and thus can be easily joined by use of thermosetting an adhesive agent or the like.

Here, the size of the pressure-generating chamber 12 applying an ink droplet ejecting pressure to ink and a size of the nozzle orifice 21 ejecting ink droplets are optimized in accordance with the amount of ink droplets to be ejected, the ejecting speed and the ejecting frequency. For example, in the case of recording 360 ink droplets per inch, it is necessary to form the nozzle orifice 21 with a diameter of several ten μm with high precision.

Meanwhile, on the elastic film 50 at the side opposite to the open face of the passage-forming substrate 10, a lower electrode film 60 having a thickness of, for example, about 0.2 μm, a piezoelectric layer 70 having a thickness of, for example, about 1 μm and an upper electrode film 30 having a thickness of, for example, about 0.1 μm are laminated in a process to be described later. These electrode films and piezoelectric layer thus constitute a piezoelectric element 300. Here, the piezoelectric element 300 means a part including the lower electrode film 60, the piezoelectric layer 70 and the upper electrode film 30. In general, the piezoelectric element 300 is configured by using any one of the electrodes thereof as a common electrode and patterning the other electrode and the piezoelectric layer 70 for each of the pressure-generating chambers 12. Consequently, here, a part which includes any one of the electrodes, that is patterned, and the piezoelectric layer 70 and in which piezoelectric strain occurs due to voltage application to the both electrodes is called a piezoelectric active portion. In this embodiment, the lower electrode film 60 is used as the common electrode of the piezoelectric element 300 and the upper electrode film 30 is used as an individual' electrode thereof. However, even if this order is reversed because of a drive circuit and wiring, there is no trouble caused thereby. In any case, the piezoelectric active portion is formed in each pressure-generating chamber. Moreover, here, the piezoelectric element 300 and the vibration plate displaced by drive of the piezoelectric element 300 are collectively called a piezoelectric actuator.

Moreover, to the upper electrode film 30 of each piezoelectric element 300 as described above, an extraction electrode 90 made of, for example, gold (Au) or the like is connected. This extraction electrode 90 is led from the vicinity of an end in a longitudinal direction of each piezoelectric element 300 and is extended above the elastic film 50 in a region corresponding to the ink supply path 14.

Moreover, the lower electrode film 60, the common electrode of the piezoelectric element 300, is continuously extended across the direction in which the pressure-generating chambers 12 are arranged and is patterned at the side of the ink supply path 14 of the pressure-generating chamber 12. Specifically, in this embodiment, the lower electrode film 60 only in a region where the extraction electrode 90 is extended on the passage forming substrate 10 is removed and is provided over the rest of the region.

Moreover, in this embodiment, on the lower electrode film 60 in a region corresponding to the outside of the array of the pressure-generating chambers 12, a laminated electrode layer 95 which is in the same layer as the extraction electrode 90 and is electrically independent of the extraction electrode 90 is provided.

Accordingly, in regions in the vicinity of the ends in the longitudinal direction of such a piezoelectric element 300, the regions facing each other, an insulation layer 110 which is made of an insulating material and extended along a direction in which the piezoelectric elements 300 are arranged is provided. For example, in this embodiment, the insulation layer 110 is continuously provided over the periphery of the array of the pressure-generating chambers 12 and a region corresponding to the array of the pressure-generating chambers 12 is formed as an opening portion 111.

Moreover, on this insulation layer 110, a connection wiring layer 120 made of a conductive material is continuously provided. This connection wiring layer 120 and the lower electrode film 60 are electrically connected to each other via a plurality of penetrated portions 112 provided in the insulation layer 110.

Here, it is preferable that the penetrated portions 112 provided in the insulation layer 110 are arranged at relatively even intervals. For example, in this embodiment, the penetrated portions 112 are respectively provided in region of the insulation layer 110 extended in the vicinity of the ends of the respective piezoelectric elements 300 at the side of the extraction electrode 90, the region facing the respective partitions 11 of the pressure-generating chambers 12. Note that a size of this penetrated portion 112 is also preferably set to 20 $\mu$m or less although not particularly limited thereto.

Moreover, in this embodiment, a penetrated portion 113 is provided also in a region facing the outside of the array of the pressure-generating chambers 12, that is, a region facing the laminated electrode layer 95 provided on the lower electrode film 60. The laminated electrode layer 95 (the lower electrode film 60) and the connection wiring layer 120 are also electrically connected with each other via this penetrated portion 113.

As described above, by electrically connecting the connection wiring layer 120 to the lower electrode film 60 that is the common electrode of the piezoelectric element 300, a resistance value of the lower electrode film 60 is substantially lowered. Moreover, similarly, by providing the laminated electrode layer 95 on the lower electrode film 60, the resistance value of the lower electrode film 60 is also substantially lowered. Therefore, even if a number of piezoelectric elements are simultaneously driven, always good and stable ink ejecting property can be obtained without causing a drop in voltage.

Moreover, since the connection wiring layer 120 is provided in the region facing the ends of the piezoelectric element 300 via the insulation layer 110, it is not necessary to secure a space for providing the connection wiring layer 120. Therefore, the ink ejecting property can be stabilized without increasing the size of the head.

Furthermore, the connection wiring layer 120 and the lower electrode film 60 are electrically connected to each other via the plurality of penetrated portions 112 and 113 of the insulation layer 110. Thus, resistance values at respective parts of the lower electrode film 60 are approximately set constant and an amount of displacement of the vibration plate due to the drive of each piezoelectric element 300 is stabilized. Consequently, the ejecting property of the ink ejected from the respective nozzle orifices can be uniformized.

Moreover, in this embodiment, the insulation layer 110 and the connection wiring layer 120 are provided outside of the region facing the array of the pressure-generating chambers 12, Thus, the connection wiring layer 120 never inhibits the displacement of the vibration plate. Therefore, the connection wiring layer 120 can be formed to be relatively thick and the resistance value of the lower electrode film 60 can be surely lowered.

Note that, in this embodiment, the respective penetrated portions 112 are provided in the region of the insulation layer 110 extended in the vicinity of the ends of the respective piezoelectric elements 300 at the side of the extraction electrode 90, the region facing the respective partitions 11 of the pressure-generating chambers 12. However, the number and positions of these penetrated portions 112 are not particularly limited thereto.

Moreover, at the side of the piezoelectric element 300 of the passage-forming substrate 10, the sealing plate 30 having the reservoir portion 31 constituting at least a part of a reservoir 105 to be a common ink chamber of the respective pressure-generating chambers 12 is joined by use of an adhesive agent 140, In this embodiment, this reservoir portion 31 is formed across the width direction of the pressure generation chambers 12 while penetrating the sealing plate 30 in its thickness direction and constitutes the reservoir 105 to be the common ink chamber of the respective pressure-generating chambers 12 by communicating with the communicating portion 18 of the passage-forming substrate 10 via a penetrated hole 51 provided, penetrating the elastic film 50.

As this sealing plate 30, a material having approximately the same coefficient of thermal expansion as that of the passage-forming substrate 10, for example, glass, a ceramics material or the like is preferably used. In this embodiment, the sealing plate 30 is formed by use of a single crystal silicon substrate, which is the same material as that of the passage-forming substrate 10.

Moreover, as to the adhesive agent 140 used for joining the passage-forming substrate 10 and the sealing plate 30, there is no particular limitation and, for example, an epoxy adhesive and the like can be enumerated.

Furthermore, in the region of the sealing plate 30, the region facing the piezoelectric elements 300, the piezoelectric element holding portion 32 is provided, which, in a state of securing a space without inhibiting the movement of the piezoelectric elements 300, can seal the space. The piezoelectric elements 300 are sealed in this piezoelectric element holding portion 32.

Moreover, between the piezoelectric element holding portion 32 and reservoir portion 31 of the sealing plate 30, that is, in the region corresponding to the ink supply paths 14, a connection hole 33 is provided, penetrating the sealing plate 30 in its thickness direction. Accordingly, the extraction electrodes 90 extracted from the respective piezoelectric elements 300 are extended up to this connection hole 33 and are connected to unillustrated external wiring by wire bonding or the like.

Moreover, with the sealing plate 30, a compliance plate 40 including a sealing film 41 and a fixed plate 42 is joined. Here, the sealing film 41 is made of a flexible material having low rigidity (for example, a polyphenylene sulfide (PPS) film with a thickness of 6 μm) and this seal film 41 seals one surface of the reservoir portion 31. Moreover, the fixed plate 42 is formed by a hard material such as metal (for example, stainless-steel (SUB) with a thickness of 30 μm or the like). A region of this fixed plate 42, the region corresponding to the reservoir 105, is an opening portion 43 which is obtained by entirely removing the fixed plate 42 in the region in its thickness direction. Thus, the one surface of the reservoir 105 is sealed only by the sealing film 41 having flexibility.

Note that such an ink-jet recording head of this embodiment takes in ink from unillustrated external ink supply means and fills the inside thereof from the reservoir 105 to the nozzle orifices 21 with ink. Thereafter, in accordance with a recording signal from an unillustrated drive circuit, the head applies voltages between the respective lower and upper electrode film 60 and 80 which correspond to the respective pressure-generating chambers 12 via the external wiring. Subsequently, the head allows the elastic film 50 and the piezoelectric element 300 to undergo flexible deformations. Thus, pressures in the respective pressure-generating chambers 12 are increased and ink droplets are ejected from the nozzle orifices 21, With reference to FIGS. 5 to 8, an example of a method of manufacturing such an ink-jet recording head of this embodiment will be described below. Note that FIGS. 5A to 5E, FIGS. 6A to 6C and FIGS. 8A and 8B are cross-sectional views showing a part in the longitudinal direction of the pressure-generating chamber 12 of a silicon wafer, and FIG. 7 is a top view of the silicon wafer.

Figure 5A:
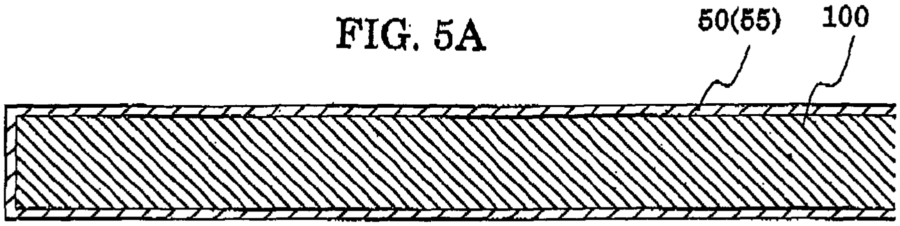
FIGS. 5A to 5E are cross-sectional views showing steps of manufacturing the ink-jet recording head according to Embodiment 1 of the present invention.

First, as shown in FIG. 5A, a silicon wafer 100 to be a plurality of passage-forming substrates is thermally-oxidized in a diffusion furnace at about 1100° C. Thus, a silicon dioxide film 55 to configure an elastic film 50 is formed all over the silicon wafer 100. This silicon dioxide film 55, which will be described later in detail, configures the elastic film 60 and is also used as a mask in etching the silicon wafer 100.

Figure 5B:
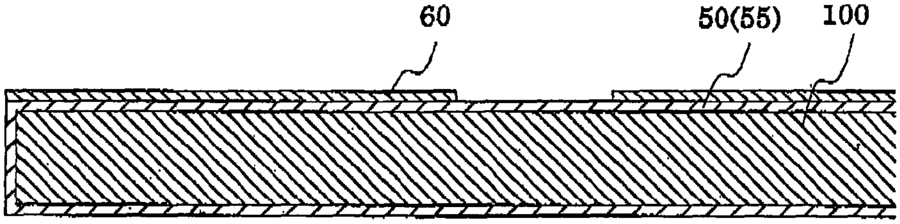

Next, as shown in FIG. 5B, a lower electrode film 60 is formed by sputtering and is patterned to have a predetermined shape. As a material of this lower electrode film 60, platinum (Pt) or the like is preferable. This is because a piezoelectric layer 70 to be described later, which is deposited by sputtering or a sol-gel method, is required to be crystallized by baking after the deposition thereof at a temperature of about 600 to 1000° C. in the atmosphere or in the oxygen atmosphere. Specifically, the material of the lower electrode film 60 must maintain its conductivity in the oxidizing atmosphere at such a high temperature. Particularly, in the case of using lead-zirconate-titanate (PZT) as the piezoelectric layer 70, it is preferable that there are few changes in conductivity owing to diffusion of the lead oxide. For these reasons described above, platinum is preferable for the material of the lower electrode film 60.

Figure 5C:
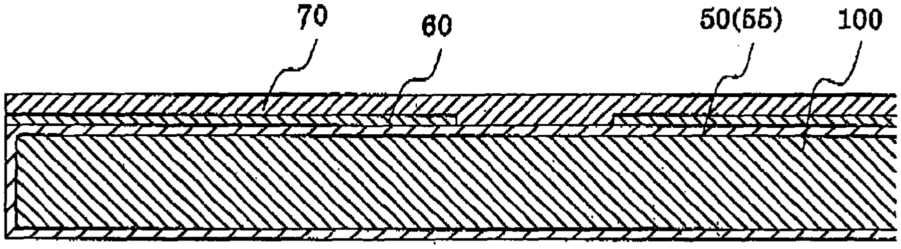

Next, as shown in FIG. 5C, the piezoelectric layer 70 is deposited. This piezoelectric layer 70 preferably has oriented crystals. For example, in this embodiment, a so-called sol, which is obtained by dissolving and dispersing a metal organic matter in a catalyst, is applied and dried to become a gel and is further baked at a high temperature. Thus, the piezoelectric layer 70 made of a metal oxide is obtained. By formation using a so-called sol-gel method, the piezoelectric layer 70 having oriented crystals is obtained. As a material of the piezoelectric layer 70, a lead-zirconate-titanate material is preferable for use in the ink-jet recording head. Note that a deposition method of this piezoelectric layer 70 is not particularly limited and, for example, a sputtering method may be used.

Furthermore, a method may also be used, in which a precursor film of lead-zirconate-titanate is formed by use of the sol-gel method, the sputtering method or the like and, thereafter, the film is subjected to crystal growth at a low temperature by use of a high-pressure processing method in an alkaline solution.

In any case, the piezoelectric layer 70 deposited in the aforementioned way has priority orientation of crystals unlike bulk piezoelectric layers. In addition, in this embodiment, the crystals of the piezoelectric layer 70 are formed in a columnar shape. Note that the priority orientation means a state where the crystals are not disorderly oriented but specific crystal planes are directed in an approximately constant direction. Moreover, a thin film having columnar crystals means a state where a thin film is formed of approximately columnar crystals which aggregate across a plane direction of the Mm in a state of making their central axes approximately coincident with a thickness direction of the film. It is needless to say that the thin film may be one formed of granular crystals subjected to priority orientation. Note that a thickness of the piezoelectric layer thus manufactured in a thin-film process is generally 0.2 to 5 μm.

Figure 5D:
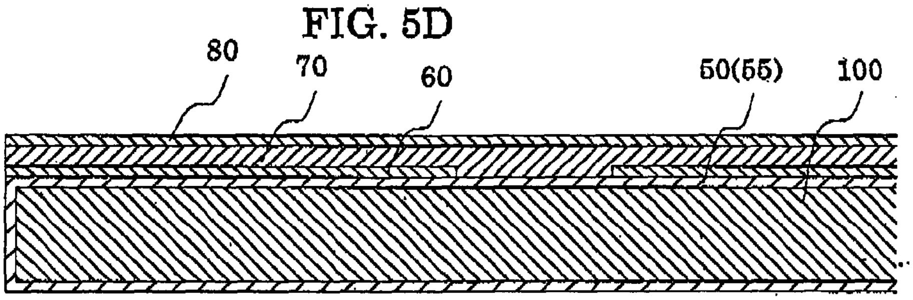

Next, as shown in FIG. 5D, an upper electrode film 30 is deposited. The upper electrode film 30 may be made of a highly-conductive material, and many kinds of metals such as aluminum, gold, nickel and platinum, a conductive oxide and the like can be used. In this embodiment, platinum is deposited by sputtering.

Figure 5E:
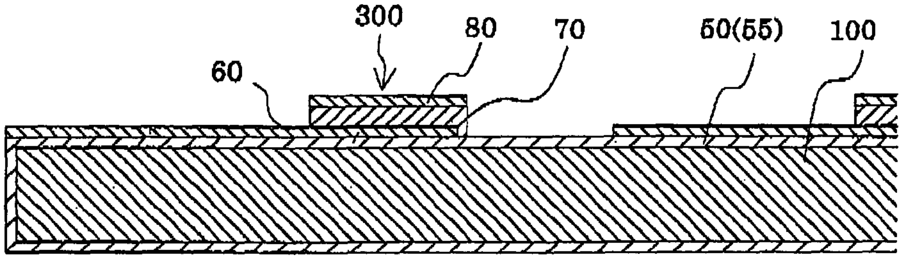

Next, as shown in FIG. 5E, patterning of a piezoelectric element 300 is performed by etching only the piezoelectric layer 70 and the upper electrode film 80.

Figure 6A:
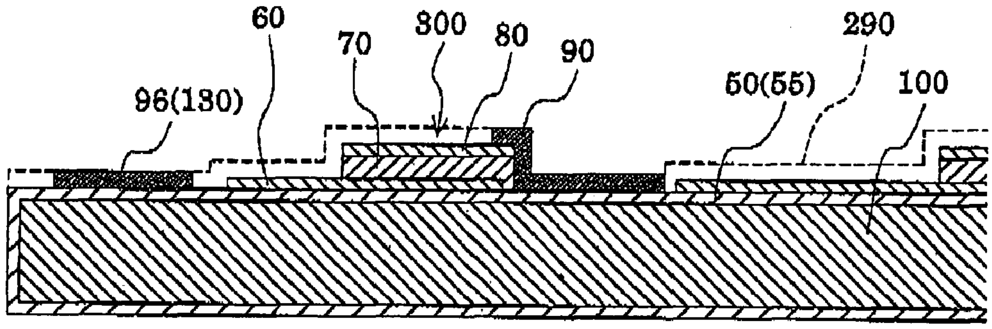
FIGS. 6A to 6C are cross-sectional views showing the steps of manufacturing the ink-jet recording head according to Embodiment 1 of the present invention.
Figure 7:
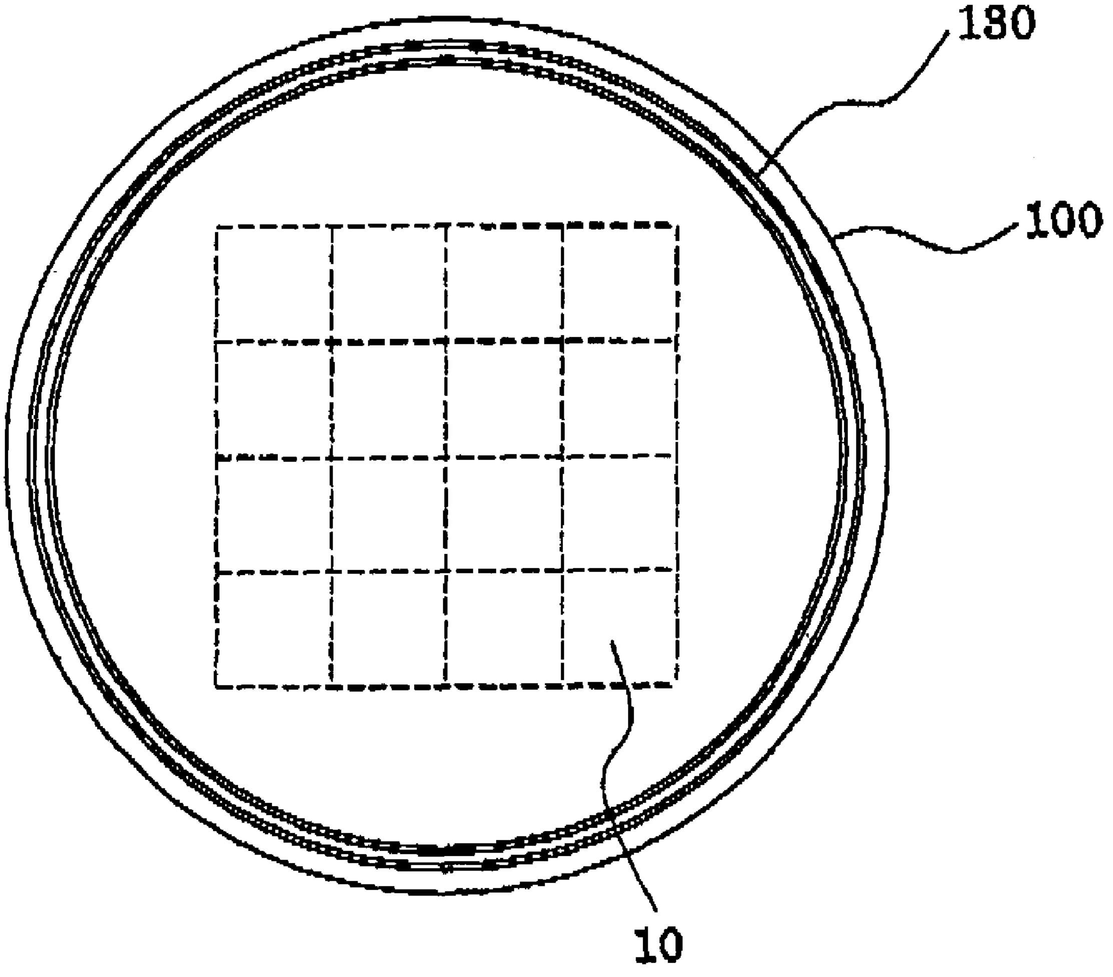
FIG. 7 is a top view of a silicon wafer, showing the steps of manufacturing the ink-jet recording head according to Embodiment 1 of the present invention.

Next, as shown in FIG. 6A, an extraction electrode 90 and a laminated electrode layer 95 (not shown) are formed. For example, in this embodiment, a first conductive layer 290 made of gold (Au) or the like is formed all over the passage-forming substrate 10. Thereafter, patterning of this first conductive layer 290 is performed for every piezoelectric element 300. Thus, each extraction electrode 90 is obtained. Moreover, in this event, the laminated electrode layer 95 is obtained by leaving the first conductive layer 290 in a region facing the outside of the array of pressure-generating chambers 12.

Furthermore, in a junction region where a sealing plate forming material to be a sealing plate 30 is joined to the silicon wafer 100 in a later process, a first moisture permeation preventive layer 96 is simultaneously formed, which will become a moisture permeation preventive pattern 130 which prevents intrusion of an etching solution used in etching the silicon wafer 100 so as not to damage the piezoelectric element 300 by the etching solution. Specifically, by leaving the fist conductive layer 290, which is continuous so as to surround the entire piezoelectric element 300, with a predetermined width, the first moisture permeation preventive layer 96 is obtained. For example, in this embodiment, the first moisture permeation preventive layer 96 is obtained by leaving the first conductive layer 290 continuously along a peripheral portion of the silicon wafer 100.

Figure 6B:
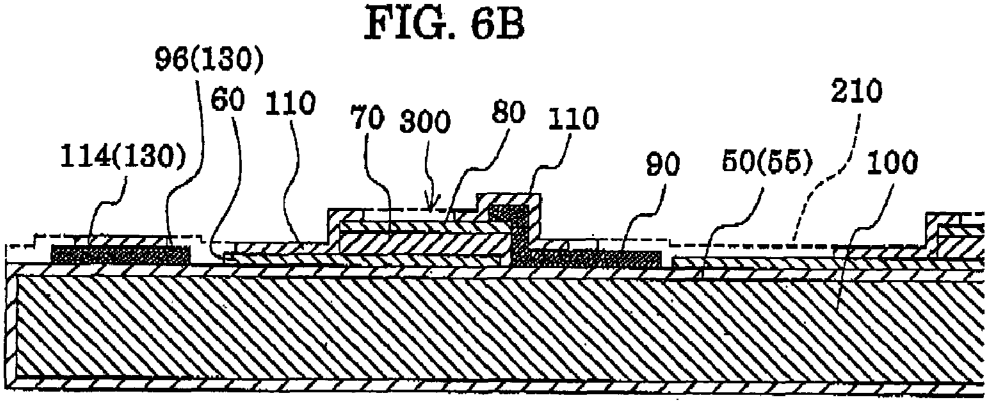

Next, as shown in FIG. 6B, an insulation layer 110 is formed around the array of pressure-generating chambers 12, and penetrated portions 112 and 113 (not shown) are formed at predetermined positions. Specifically, after forming an insulation layer forming film 210 all over the silicon wafer 100, an opening portion 111 (not shown) and the penetrated portions 112 and 113 are formed by etching the insulation layer forming film 210, Thus, the insulation layer 110 is obtained.

Moreover, in this event, a second moisture permeation preventive layer 114 to become the moisture permeation preventive pattern 130 is simultaneously formed. Specifically, the insulation layer forming film 210 is left on the first moisture permeation preventive layer 96 so as to have a narrower width than the first moisture permeation preventive layer 96. Thus, the second moisture permeation preventive layer 114 is obtained.

As a material of this insulation layer forming film 210, for example, photosensitive resin such as polyimide is preferably used. Thus, the insulation layer 110 and the second moisture permeation preventive layer 114, which are made of the insulation layer forming film 210, can be relatively easily formed with high precision. Moreover, the material of the insulation layer forming film 210 is not particularly limited to the above as long as the material has a relatively good insulation property. For example, fluorocarbon resin, silicone resin, epoxy resin, silicon dioxide, silicon nitride, tantalum oxide or the like may be used.

Figure 6C:
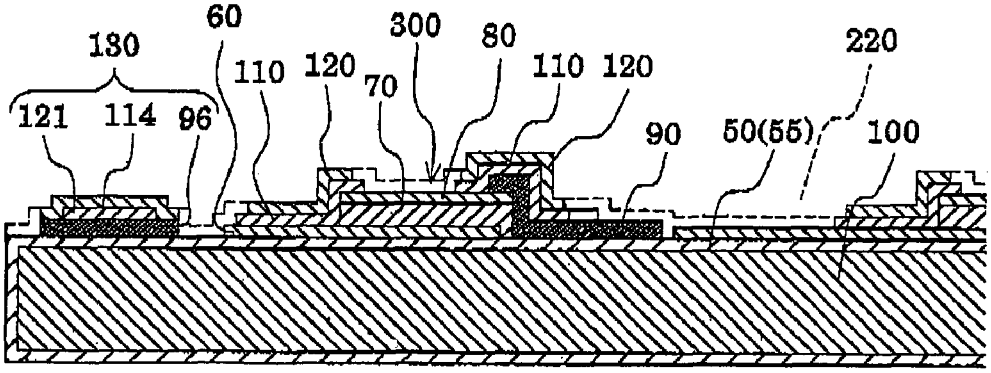

Next, as shown in FIG. 6C, a connection layer 120 is formed on the insulation layer 110. Specifically, after depositing a second conductive layer 220 all over the passage-forming substrate 10, the connection wiring layer 120 having a predetermined pattern is obtained by etching the second conductive layer 220.

As described earlier, this connection wiring layer 120 is for lowering the resistance value of the lower electrode film 60. Thus, as the second conductive layer 220, at least a metal having specific resistance smaller than that of the lower electrode film 60 is preferably used. For example, gold (Au), copper (Cu), aluminum (Al) and the like are enumerated. For example, in this embodiment, gold (Au) is formed by sputtering.

Moreover, in this event, a third moisture permeation preventive layer 121 to become the moisture permeation preventive pattern 130 is simultaneously formed. Specifically, the second conductive layer 220 is left on the first moisture permeation preventive layer 96 so as to cover the top and sides of the second moisture permeation preventive layer 114. Thus, the third moisture permeation preventive layer 121 is obtained. Consequently, as shown in FIG. 7, the moisture permeation preventive pattern 130 including the first, second and third moisture permeation preventive layers 96, 114 and 121 is continuously formed along the entire circumference portion of the silicon wafer 100.

Figure 8A:
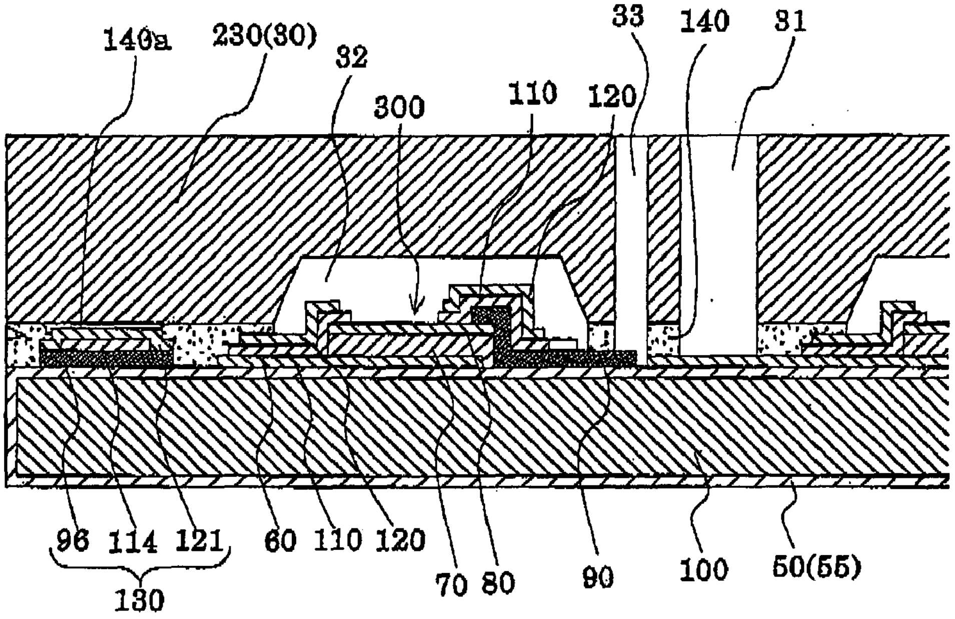
FIGS. 8A and 8B are cross-sectional views showing the steps of manufacturing the ink-jet recording head according to Embodiment 1 of the present invention.

The foregoing is the film formation process. After the film is formed as described above, a sealing plate forming material 230 to be the sealing plate 30 is joined to the silicon wafer 100 through the moisture permeation preventive pattern 130 interposed therebetween, as shown in FIG. 8(A). In this embodiment, the silicon wafer 100 and the sealing plate forming material 230 are joined by use of the adhesive agent 140.

As described above, when the silicon wafer 100 and the sealing plate forming material 230 are joined by use of the adhesive agent 140, only an adhesive layer **140*a* which is relatively thinner than other junction regions is formed on the moisture permeation preventive pattern 130**.

Moreover, in a junction region between the passage-forming substrate 10 to be an ink-jet recording head by being divided in a later process and the sealing plate 30, the moisture permeation preventive pattern 130 provides a desired gap. Thus, the adhesive agent 140 with a desired thickn ss is formed in this junction region. Consequently, a junction strength between the passage-forming substrate 10 and the sealing plate 30 can be secured, and an ink-jet recording head achieving secure junctions can be manufactured.

Figure 8B:
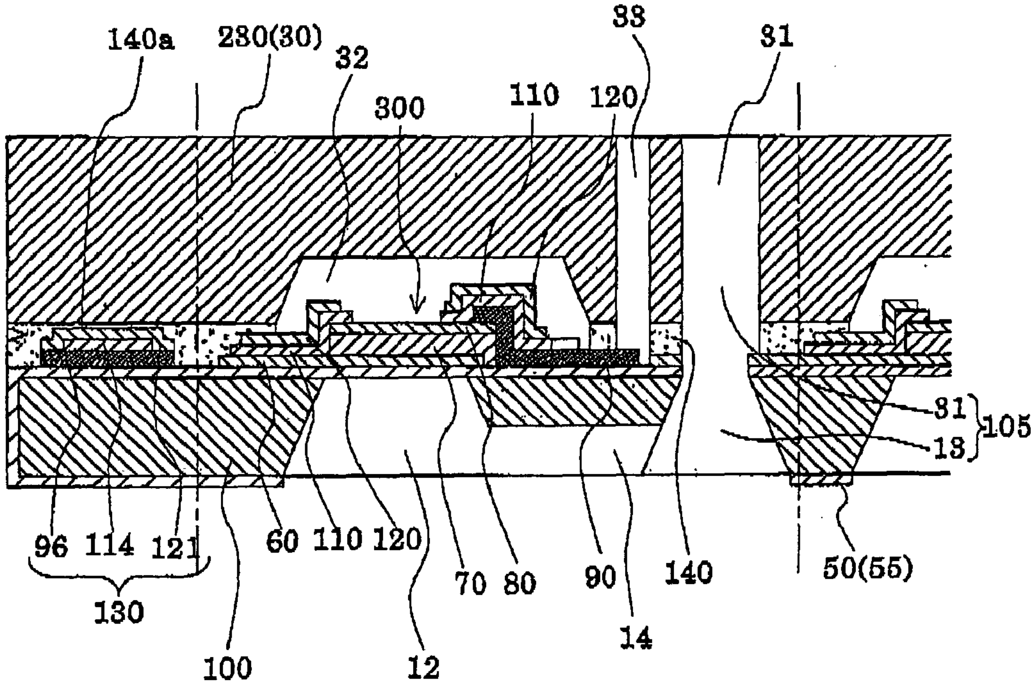

Next, as shown in FIG. 8B, a silicon dioxide film 55 is patterned and the other surface of the silicon wafer 100 is etched by use of the patterned silicon dioxide film 55 as a mask. Thus, the pressure generating chamber 12, the ink supply path 14 and the communicating portion 13 are formed. In this embodiment, the other surface of the silicon wafer 100 is subjected to anisotropic etching by use of an alkaline solution such as KOH, and thererby the pressure-generating chamber 12, the ink supply path 14 and the communicating portion 18 are formed.

Here, when the silicon wafer 100 is etched by use of an etching solution such as the alkaline solution of KOH or the like, a portion where the silicon wafer 100 and the sealing plate forming material 230 are joined is also dipped in the etching solution. However, the moisture permeation preventive pattern 130 is continuously formed in the peripheral portion of the silicon wafer 100 so as to surround the entire piezoelectric element 300, and the adhesive layer **140*a* is relatively thin. Thus, it is possible to prevent the etching solution from intruding into the piezoelectric element holding portion 32 via this adhesive layer 140*a*. Moreover, in the moisture permeation preventive pattern 130, the second moisture permeation preventive layer 114 made of photosensitive resin such as polyimide is covered with the first and third moisture permeation preventive layers 96 and 121 so as not to expose the surface thereof. Thus, the etching solution never intrudes into the piezoelectric element holding portion 32 via this second moisture permeation preventive layer 114 and never melts the second moisture permeation preventive layer 114. Consequently, the thin-film pattern such as the piezoelectric element 300** can be surely prevented from being damaged by the etching solution.

Thereafter, on a surface of the silicon wafer 100 at the opposite side of the sealing plate forming material 230, a nozzle plate 20 having nozzle orifices 21 drilled therein is joined. Subsequently, the silicon wafer 100 and the like is divided for every one chip-size passage-forming substrate 10, except for the region where the moisture permeation preventive pattern 130 is formed, as shown in FIG. 1. Thus, the ink-jet recording head of this embodiment is obtained.

(Embodiment 2)

Figure 9:
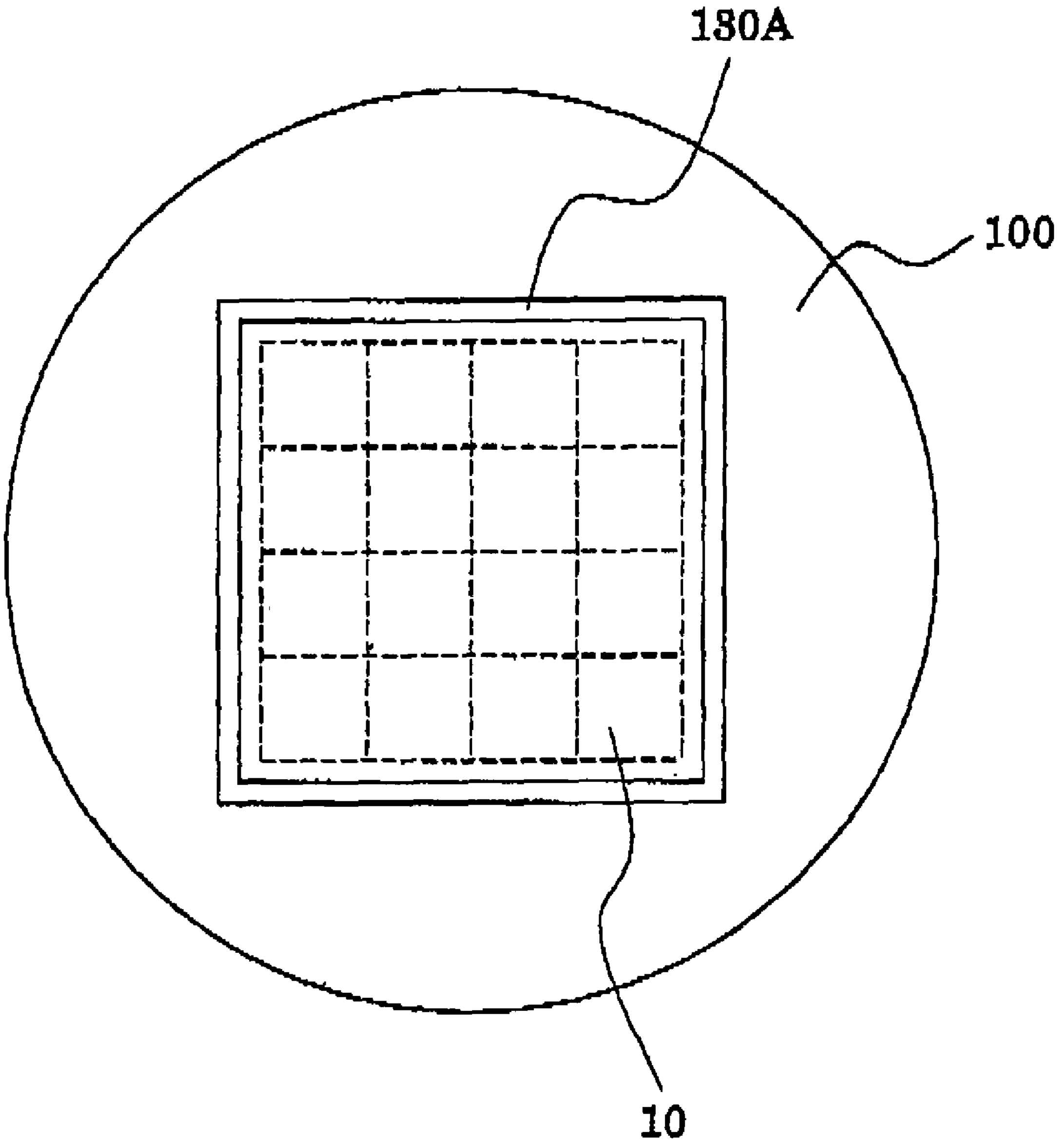
FIG. 9 is a top view of a silicon wafer, showing steps of manufacturing an ink-jet recording head according to Embodiment 2 of the present invention.

FIG. 9 is a top view of a silicon wafer, showing a method of manufacturing an ink-jet recording head according to Embodiment 2 of the present invention.

As shown in FIG. 9, in Embodiment 2, a moisture permeation preventive pattern 130A is formed in a rectangular shape continuous along a periphery of a region divided into pieces with one chip size in a silicon wafer 100, so as to surround the entire region to be divided. Note that a formation process of films including the moisture permeation preventive pattern 130A and a series of manufacturing process thereafter such as etching and division are the same as those of embodiment 1 described above. Thus, repetitive description thereof will be omitted.

As described above, even if the moisture permeation preventive pattern 130A is formed continuously along the periphery of the region to be divided for every passage-forming substrate 10 on the silicon wafer 100, it is possible to prevent damage of the piezoelectric element 300 due to the etching solution such as the alkaline solution in the etching, similarly to Embodiment 1 described above.

(Other Embodiments)

Embodiments 1 and 2 have been described above. However, it is needless to say that the present invention is not limited thereto.

For example, in the above-described Embodiments 1 and 2, the moisture permeation preventive patterns 130 and 130A are independently formed. However, there is no particular limitation thereto and it is needless to say that the two moisture permeation preventive patterns 130 and 130A may be formed by combining the both. Thus, it is possible to further surely prevent damage of the thin-film pattern such as the piezoelectric element 300 due to the etching solution used in the etching.

Moreover, in the above-described Embodiments 1 and 2, the moisture permeation preventive patterns 130 and 130A are provided in the peripheral portion of the silicon wafer 100 within the junction region or along the periphery of the region to be divided, respectively. However, as long as the thin-film pattern such as the piezoelectric element 300 on the silicon wafer can be surrounded by the moisture permeation preventive pattern, the moisture permeation preventive pattern may be formed at any position in the junction region. In addition, the shape thereof is also not particularly limited thereto. For example, the moisture permeation preventive patterns 130 and 130A may be provided at least in a part of the junction region between the sealing plate 30 and the passage-forming substrate 10 to be each ink-jet recording head. Thus, in obtaining the ink-jet recording head by dividing the silicon wafer 100, a laminated pattern may be provided, which is formed in such a manner that the moisture permeation preventive pattern remains at least in a part of the junction region between the passage-forming substrate 10 of the ink-jet recording head and the sealing plate 30.

Furthermore, in forming the moisture permeation preventive pattern on the silicon wafer 100 as the laminated pattern, the pattern may be provided continuously along peripheral portions of ink-jet recording heads obtained by dividing the silicon wafer 100. Specifically, the moisture permeation preventive pattern is provided on the silicon wafer 100 continuously across the junction region between the respective passage-forming substrates 10 of the ink-jet recording heads and the sealing plate 30. Thus, in dividing the silicon wafer 100, the moisture permeation preventive pattern remains, which is continuous so as to surround the piezoelectric element holding portion 32 across the junction region between the respective passage-forming substrates 10 of the ink-jet recording heads and the sealing plate 30. Consequently, an individual moisture permeation preventive pattern is formed. By use of this individual moisture permeation preventive pattern, moisture can be surely prevented from permeating the piezoelectric element holding portion 32 via the adhesive agent 140 from the outside. Thus, damage of the piezoelectric element 300 attributable to the external environment can be surely prevented.

Note that, as the laminated pattern, both having a part of the moisture permeation preventive pattern remaining therein as described above and the individual moisture permeation preventive pattern may be provided. Thus, the intrusion of the etching solution into the piezoelectric element holding portion 32 in manufacturing can be further surely prevented. At the same time, as a finished ink-jet recording head, moisture can be prevented from permeating the piezoelectric element holding portion 32 via the adhesive agent from the outside.

Moreover, for example, in the foregoing Embodiments 1 and 2, the thin-film ink-jet recording head manufactured by applying the deposition and lithography process thereto was taken as an example. However, it is needless to say that the present invention is not limited thereto. For example, the present invention can also be adopted in a thick-film ink-jet recording head formed by use of a method of attaching a green sheet and the like.

Moreover, in the foregoing Embodiments 1 and 2, the description was given of, as an example, a method of manufacturing an ink-jet recording head used for printing predetermined images and characters on printing media, as the liquid jet head. However, it is needless to say that the present invention is not limited thereto. The present invention can also be applied to a method of manufacturing other liquid jet heads including, for example: a color material jet head used for manufacturing color filters of a liquid crystal display and the like; an electrode material jet head used for forming electrodes of an organic EL display, a field emission display (FED) and the like; a bio-organic matter jet head used for manufacturing biochips; and the like.

Furthermore, the present invention is not limited to the method of manufacturing the liquid jet head, but can be applied to, for example, a method of manufacturing a silicon device having a thin-film pattern on a silicon substrate such as a semiconductor.

As described above, in the present invention, the moisture permeation preventive pattern continuous so as to surround the thin-film pattern on the silicon wafer is formed in the junction region where the silicon wafer and the sealing plate are joined, the moisture permeation preventive pattern including the sequentially laminated first to third moisture permeation preventive layers. Thus, the adhesive agent on the moisture permeation preventive pattern can be made relatively thin and the etching solution used in etching the silicon wafer can be prevented from intruding into the thin-film pattern holding portion via the adhesive agent. Moreover, the second moisture permeation preventive layer included in the moisture permeation preventive pattern is covered by the first and third moisture permeation preventive layers, and thus the second moisture permeation preventive layer never melts due to the etching solution. Consequently, the etching solution can be prevented from intruding into the thin-film pattern holding portion via the second moisture permeation preventive layer, and damage of the piezoelectric element can be surely prevented. Moreover, the silicon wafer and the sealing plate are joined through the moisture permeation preventive pattern interposed therebetween. Thus, the adhesive agent with a desired thickness can be formed in a region other than the moisture permeation preventive pattern, and the silicon wafer and the sealing plate can be surely joined.

What is claimed is:

1. A method of manufacturing a silicon device in which a sealing plate having a thin-film pattern holding portion defining a space for sealing a thin-film pattern is joined to a silicon substrate which has the thin-film pattern including at least a first conductive layer, an insulation layer and a second conductive layer that are sequentially laminated and has a concave portion on a side opposed to the thin-film pattern, the method comprising the steps of:

in forming the thin-film pattern on one surface of a silicon wafer, forming a moisture permeation preventive pattern in such a manner that a first moisture permeation preventive layer is formed in the same layer as the first conductive layer on the silicon wafer so as to surround the entire thin-film pattern of the silicon wafer, a second moisture permeation preventive layer with a width narrower than that of the first moisture permeation preventive layer is formed in the same layer as the insulation layer on the first moisture permeation preventive layer, and a third moisture permeation preventive layer is formed in the same layer as the second conductive layer on the second moisture permeation preventive layer so as to cover the second moisture permeation preventive layer;

joining the sealing plate onto the silicon wafer through the moisture permeation preventive pattern interposed therebetween; and forming the concave portion by etching the silicon wafer from the other surface thereof.

2. The method of manufacturing a silicon device according to claim 1, wherein the moisture permeation preventive pattern is continuously formed along a peripheral portion of the silicon wafer.

3. The method of manufacturing a silicon device according to claim 1, wherein the concave portion is formed by subjecting the silicon wafer to wet etching.

4. The method of manufacturing a silicon device according to any one of claims 1 to 3, wherein the second moisture permeation preventive layer is made of photosensitive resin.

5. The method of manufacturing a silicon device according to claim 4, wherein the photosensitive resin is polyimide.

6. The method of manufacturing a silicon device according to any one of claims 1 to 3, wherein the second moisture permeation preventive layer is made of one of fluorocarbon resin, silicone resin, epoxy resin, silicon dioxide, silicon nitride and tantalum oxide.

* * * * *